United States Patent
Yamazaki et al.

(10) Patent No.: US 6,686,281 B2
(45) Date of Patent: Feb. 3, 2004

(54) METHOD FOR FABRICATING A SEMICONDUCTOR DEVICE AND A SUBSTRATE PROCESSING APPARATUS

(75) Inventors: Hirohisa Yamazaki, Tokyo (JP); Takaaki Noda, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 10/234,520

(22) Filed: Sep. 5, 2002

(65) Prior Publication Data

US 2003/0119288 A1 Jun. 26, 2003

(30) Foreign Application Priority Data

Sep. 5, 2001 (JP) .......................... 2001-268265

(51) Int. Cl.[7] .............................. H01L 21/311
(52) U.S. Cl. ............... 438/680; 438/488; 438/495; 438/499; 438/933; 438/935; 438/936; 438/341
(58) Field of Search ............... 438/565, 680, 438/495, 488, 499, 505, 508, 933, 341; 118/724, 715; 257/183; 427/568, 39

(56) References Cited

U.S. PATENT DOCUMENTS

| | | | |
|---|---|---|---|
| 4,716,048 A | * 12/1987 | Ishihara et al. | 427/568 |
| 4,726,963 A | * 2/1988 | Ishihara et al. | 427/568 |
| 5,246,886 A | * 9/1993 | Sakai et al. | 438/488 |
| 5,906,680 A | * 5/1999 | Meyerson | 117/88 |
| 6,110,531 A | * 8/2000 | Paz de Araujo et al. | 427/255.25 |
| 6,511,718 B1 | * 1/2003 | Paz de Araujo et al. | 427/576 |
| 2002/0160587 A1 | * 10/2002 | Jagannathan et al. | 438/510 |
| 2003/0022528 A1 | * 1/2003 | Todd | 438/933 |

* cited by examiner

*Primary Examiner*—Matthew Smith
*Assistant Examiner*—Belur V Keshavan
(74) *Attorney, Agent, or Firm*—Bacon & Thomas, PLLC

(57) ABSTRACT

A substrate processing apparatus for forming a boron doped silicon-germanium film on one or more substrates in a reaction furnace of a low pressure CVD apparatus uses a mixture gas of $GeH_4$ and $SiH_4$ as a reaction gas, and $BCl_3$ as a doping gas. The substrate processing apparatus includes a plurality of gas outlets for supplying $GeH_4$ at different locations in the reaction tube and a doping gas line for supplying $BCl_3$ at least at an upstream side of gas flow in the reaction tube.

10 Claims, 3 Drawing Sheets

METHOD FOR FABRICATING A SEMICONDUCTOR DEVICE AND A SUBSTRATE PROCESSING APPARATUS

FIELD OF THE INVENTION

The present invention relates to a method for fabricating a semiconductor device and substrate processing apparatus; and, more particularly, to a semiconductor device fabricating method and a substrate processing apparatus capable of depositing a boron doped polycrystalline silicon-germanium film or a boron doped amorphous silicon-germanium film by means of a low pressure CVD (Chemical Vapor Deposition) method.

BACKGROUND OF THE INVENTION

A low pressure CVD method has been widely used in forming thin films in the course of fabricating semiconductor devices, e.g., IC, LSI or the like. Such thin film forming processes include depositing of a silicon-germanium film on a substrate.

Silicon-germanium is employed in growing an epitaxial base region of a heterojunction bipolar transistor (HBT) and forming a polycrystalline silicon-germanium film as a portion of a gate electrode of a MOS transistor.

In a conventional polycrystalline silicon-germanium film forming process by a vertical type low pressure CVD apparatus, diborane ($B_2H_6$) is used for doping boron. Since, however, the gas phase reaction of diborane is rather strong, diborane reacts not only with wafers but also in other portions of a reaction chamber. Further, since boron is readily doped in a deposited film, a consumption rate thereof is great. Accordingly, the uniformity in boron concentration within a wafer and between wafers is deteriorated.

That is, since diborane is rapidly depleted, the concentration thereof becomes less at the downstream side thereof. Consequently, inter-wafer uniformity of boron concentration becomes degraded. In order to solve the foregoing problem thereof, i.e., to improve the boron concentration uniformity, it becomes necessary to install a plurality of diborane gas supplement nozzles in an inner space of the reaction chamber, to compensate for the rapid depletion of the diborane gas.

Further, as the diborane gas flows toward a central surface portion of a wafer, the diborane gas is continuously consumed and thus the concentration thereof is getting less, resulting in the nonuniformity in the boron concentration within a single wafer. The uniformity of boron concentration within a wafer can be improved by increasing a gap between wafers.

However, further, in case of growing SiGe films, in addition to the diborane gas supplement nozzles for doping, a number of monogermane ($GeH_4$) gas supplement nozzles are also required to ensure intra-wafer and inter-wafer Ge concentration uniformity. In such a case, the number of nozzles and mass flow controllers for controlling flow rates are undesirably increased. In addition, when the gap between the wafers increases, the number of the wafers which can be processed at one time is reduced. For example, when the gap between the wafers becomes double, the number of the wafers which can be processed at one time is reduced to one half.

SUMMARY OF THE INVENTION

It is therefore, an object of the present invention to provide a semiconductor device fabricating method and a substrate processing apparatus capable of depositing a boron doped polycrystalline silicon-germanium film or a boron doped amorphous silicon-germanium film by means of a low pressure CVD method, while maintaining an improved uniformity in the boron concentration without requiring a number of gas supplement nozzles for supplying a doping gas.

In accordance with a preferred embodiment of the present invention, there is provided a semiconductor device fabricating method for forming a boron doped silicon-germanium film on one or more substrates in a reaction furnace of a low pressure CVD apparatus, including the steps of: loading said one or more substrates into the reaction furnace; supplying $GeH_4$ and $SiH_4$ as a reaction gas to the reaction furnace; and supplying $BCl_3$ as a doping gas to the reaction furnace.

In accordance with another preferred embodiment of the present invention, there is provided a substrate processing apparatus for forming a boron doped silicon-germanium film on a wafer, including: a reaction tube in which at least one substrate is processed; a heater for heating said at least one substrate in the reaction tube; a first gas supplying line for supplying $SiH_4$ to the reaction tube; a second gas supplying line for supplying $GeH_4$ to the reaction tube; and a third gas supplying line for supplying $BCL_3$ to the reaction tube.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

A method for fabricating a semiconductor device in accordance with the present invention is to deposit a boron doped polycrystalline silicon-germanium film or a boron doped amorphous silicon-germanium film on a substrate, i.e., a wafer, by using a monosilane ($SiH_4$) gas and a monogermane ($GeH_4$) gas as reaction gases and a boron trichloride ($BCl_3$) gas as a doping gas, wherein the method for fabricating the semiconductor device is performed in a batch type vertical low pressure CVD apparatus having a hot-wall furnace. By using the boron trichloride gas as a doping gas, it becomes unnecessary to install a plurality of gas supplement nozzles, which is required in case of using diborane as a doping gas to ensure the B concentration uniformity within a wafer and between wafers. In the preferred embodiment of the present invention, the monogermane gas is supplied at several locations in furnace to ensure a uniform Ge concentration within a wafer and between wafers.

Figure 1:
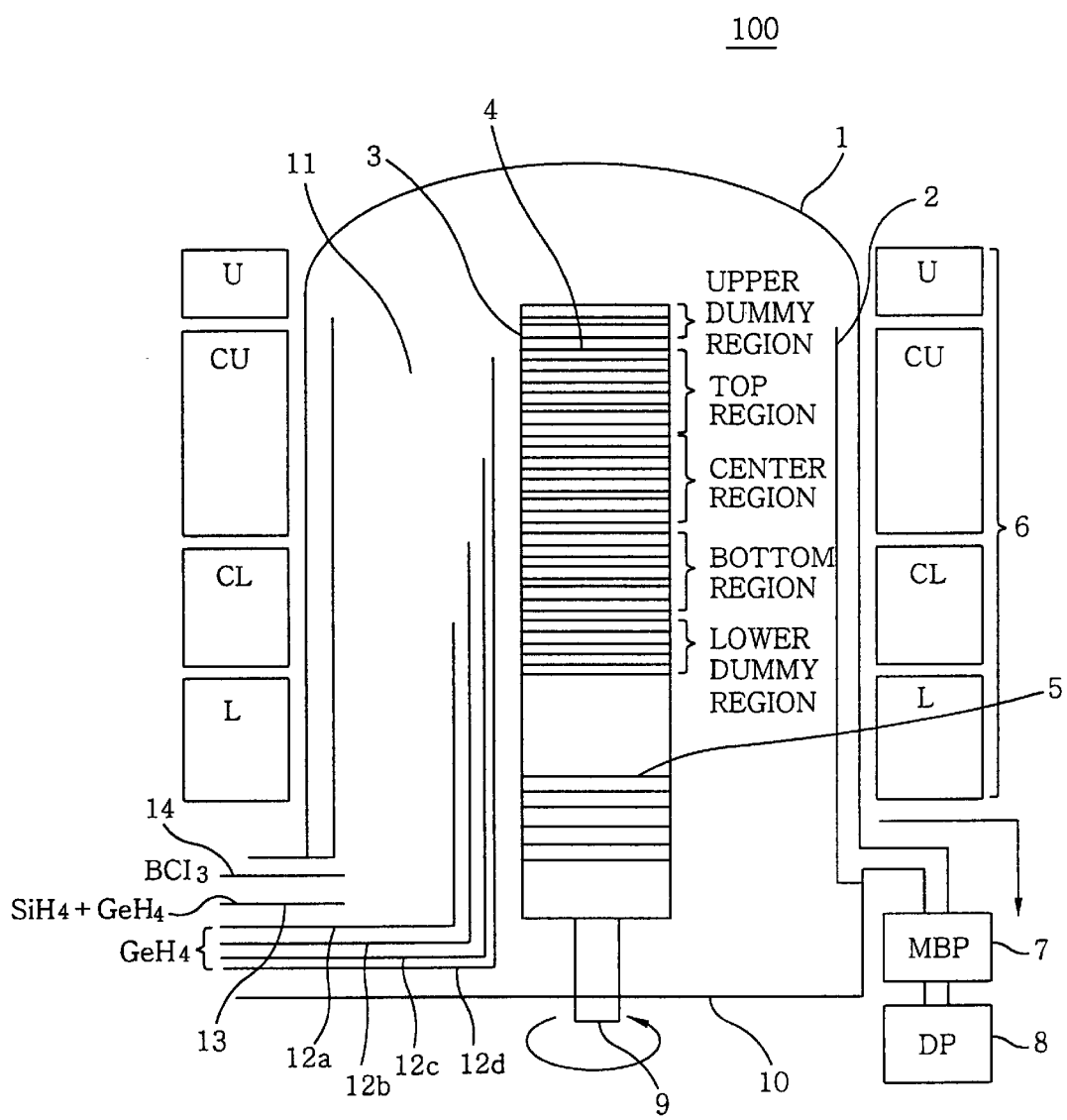
FIG. 1 shows a schematic view of a substrate processing apparatus in accordance with the preferred embodiment of the present invention.

Referring to FIG. 1, there is shown a schematic view of a substrate processing apparatus in accordance with the preferred embodiment of the present invention. The substrate processing apparatus 100 includes a reaction tube, i.e., an outer tube 1 made of quartz and constituting an outer shell of a reaction furnace 11, and an inner tube 2 disposed inside the outer tube 1. Provided around the side wall of the outer tube 1 is a heater 6 constituting a hot-wall furnace. The heater 6 is divided into four zones heating wafers 4 loaded in the reaction furnace 11. The outer tube 1 and the inner tube 2 define an intermediate space which is inside of the outer tube 1 and outside of the inner tube 2. The reaction furnace 11 is evacuated by a mechanical booster pump 7 (MBP) and a dry pump 8 through the space formed between the outer tube 1 and the inner tube 2. The substrate processing apparatus 100 is also provided with gas supply lines for supplying reaction gases and a doping gas, which flow upwards in the inner tube 2 and pumped out from the reaction furnace 11 after descending through the space between the outer tube 1 and the inner tube 2. The gas supply lines include a main reaction gas line 13 for supplying $GeH_4$ and $SiH_4$ as reaction gases at the bottom region of the reaction furnace 11; a doping gas line 14 for supplying $BCl_3$ as a doping gas at the bottom region of the reaction furnace 11; and four supplementary reaction gas lines 12a to 12d for supplementing $GeH_4$ gas. Disposed in the inner tube 2 is a quartz boat 3 holding a plurality of the wafers 4 serving as substrates to be processed. The wafers 4 are exposed to the reaction gas and the doping gas supplied to the inner space of the reaction furnace 11, so that a boron doped polycrystalline silicon-germanium film or a boron doped amorphous silicon germanium film is deposited on the wafers 4 by the gas phase and the surface reaction of the reaction and doping gases.

Reference numerals 5, 9 and 10 respectively represent an insulation plate for thermally insulating a lower portion of the apparatus 100 from the boat 3, a boat rotation shaft and a stainless cover.

The boat 3 is provided with vertically arranged 172 slots for horizontally supporting the wafers 4 with their centers vertically aligned. The slots are divided into an upper dummy region, a top region, a center region, a bottom region and a lower dummy region. The lower dummy region ranging from the first slot, i.e., the lowest slot to the 10th slot and the upper dummy region ranging from the 168th slot to the 172nd slot are filled with dummy wafers. The bottom region ranging from the 11th slot to the 36th slot, the center region ranging from the 37th slot to the 128th slot and the top region ranging from the 129th slot to the 167th slot are loaded with the product wafers. The heater 6 is divided into 4 zones. A lowest zone L (lower) corresponds to a lower region of the boat 3 up to the lowest slot thereof. Therefore, there exists only one dummy wafer in a region of the boat 3 corresponding to the zone L. A second lowest zone CL (center lower) disposed above the zone L corresponds to a region from the 2nd slot to the 56th slot where the dummy and the product wafers coexist; a zone CU (center upper) disposed above the CL zone corresponds to a region from the 57th slot to the 172nd slot where the dummy and the product wafers also coexist; and an uppermost zone U (upper) disposed above the CU zone corresponds to a region above the uppermost region of the boat 3 where no wafer exists.

A mixture gas of $SiH_4$ and $GeH_4$ is supplied as a reaction gas at the bottom region of the reaction furnace 11 by the main reaction gas line 13. $GeH_4$ is supplied as a reaction gas by the supplement reaction gas lines 12a to 12d at various spots along the path of gas flow in the reaction furnace 11. More particularly, the gas outlets of the supplement reaction gas lines 12a to 12d are fairly evenly spaced apart from each other at heights corresponding to the 30th slot, the 70th slot, the 110th slot and the 150th slot of the boat 3. $BCl_3$ is supplied as the doping gas at the bottom region of the reaction furnace 11 by the doping gas line 14.

$BCl_3$ has a lower reactivity than $B_2H_6$. Thus, $BCl_3$ is less depleted along the path of gas flow than $B_2H_6$. Therefore, the boron concentration in the product wafers 4 loaded in the boat 3 can be made to be uniform even without installing any supplement doping gas lines as FIG. 1. Further, even without maintaining a wide gap between the wafers 4, $BCl_3$ can be supplied to the center region of each of the wafers 4, resulting in fairly uniform boron concentration distribution in each wafer. However, $GeH_4$ is highly reactive and thus rapidly depleted along the path thereof. Therefore, without supplementing $GeH_4$ to compensate for the rapid depletion thereof, the concentration of $GeH_4$ is varied greatly along the path thereof, which in turn results in the nonuniformity in the film thickness and the Ge concentration within a single wafer and between wafers. To solve the afore-mentioned problem, $GeH_4$ is supplemented into the reaction furnace 11 through the supplement reaction gas lines 12a to 12d as shown in FIG. 1 in accordance with the present invention.

Figure 2:
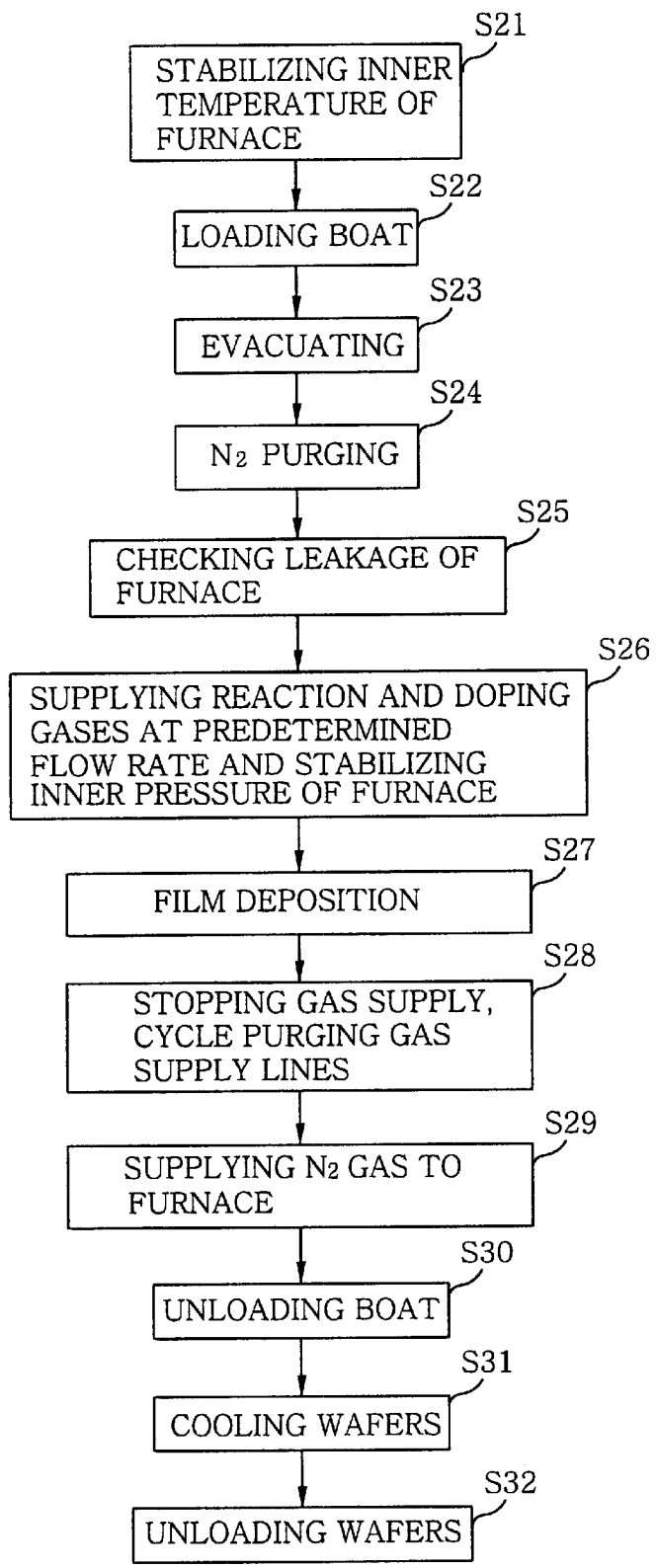
FIG. 2 is a flow chart for illustrating the steps of forming a thin film by using a low pressure CVD method.

Referring FIG. 2 there is shown a flow chart of a process for depositing a thin film by using the apparatus 100 shown in FIG. 1.

After stabilizing inner temperature of the reaction furnace 11 at a thin film forming temperature (step S21), the boat 3 holding the wafers 4 is loaded into the reaction furnace 11 (step S22). Thereafter, the reaction furnace 11 is evacuated (step S23) and $N_2$ purge gas is fed into the reaction furnace 11 to remove moisture or the like on the boat 3, the inner tube 2 and the outer tube 1 (step S24). A leakage check of the reaction furnace 11 is then performed (step S25). Subsequently, $SiH_4$, $GeH_4$ and $BCl_3$ are supplied at predetermined flow rates to stabilize the inner pressure of the reaction furnace 11 (step S26). Consequently, the thin film, i.e., the boron doped polycrystalline silicon-germanium film or the boron doped amorphous silicon-germanium film is formed on the wafers 4 by means of the low pressure CVD method (step S27). After the completion of depositing the thin film, the supply of the reaction and doping gases stops and a cycle purge operation is performed to clear the gas supply lines (step S28). Then, the inner pressure of the reaction furnace 11 is increased to the atmospheric pressure by supplying $N_2$ gas thereto (step S29). Thereafter, the boat 3 is unloaded from the reaction furnace 11 (step S30), to naturally cool down the wafers 4 (step S31). Finally, the wafers 4 are unloaded from the boat 3 (step S32).

Preferable conditions for depositing a thin film are as follows: the film forming temperature is in the range from about 350 to 550° C.; the film forming pressure, from about 10 to 130 Pa; the partial pressure of $SiH_4$, from about 10 to 79.8 Pa; the partial pressure of $GeH_4$ is less than 48 Pa; the partial pressure of $BCl_3$ is in the range from about 0.00016 to 2.2 Pa; a flow rate ratio of the $GeH_4$ to $SiH_4$ is equal to or less than about 0.6; and a flow rate ratio of $BCl_3$ to $SiH_4$, from about 0.000017 to 0.028.

If the film forming temperature is less than about 350° C., the silicon-germanium film is not formed since a thermal decomposition of the $GeH_4$ is not induced. In contrast, if the temperature is greater than about 550° C., there occurs a depletion of the gases (especially, $GeH_4$) at an upper portion of the reaction furnace 11 (i.e., a downstream side of the gas flow), which in turn causes the film growth rates at the upstream and the downstream side of gas flow to differ from each other. Thus, the uniformity in the film thickness and the germanium concentration between the wafers become deteriorated. Accordingly, the preferable film forming temperature is in the range from about 350 to 550° C.

As the film forming pressure is decreased, the partial pressure of each of the gases ($SiH_4$, $GeH_4$, $BCl_3$) is also decreased, so that the growth rate of the thin film is reduced. In particular, if the pressure is reduced down to less than about 10 Pa, the growth rate becomes too small to be used in practice. In contrast, as the pressure is increased, the growth rate is also increased while the uniformity of the film thickness becomes worse. In particular, if the pressure is greater than about 130 Pa, the uniformity of the film thickness is severely deteriorated. Accordingly, the preferable pressure is in the range from about 10 to 130 Pa. And at the same time, it is preferable that the partial pressure of $SiH_4$ is in the range from about 10 to 79.8 Pa; that of $GeH_4$ is equal to or less than about 48 Pa; and that of $BCl_3$ is in the range from about 0.00016 to 2.2 Pa. By setting the pressures of the gases as described above, practical growth rate and favorable uniformity in the film thickness can be obtained.

If the ratio of the $GeH_4$ flow rate to the $SiH_4$ flow rate is greater than about 0.6, a surface roughness of the film is increased and the uniformity of the film thickness is deteriorated. Also, since the consumption of the gases (especially $GeH_4$) is increased, growth rates at the downstream side and the upstream side of gas flow become severely different from each other and, thus, the uniformity in the film thickness and the germanium concentration between the wafers becomes worse. Accordingly, the preferable ratio of the $GeH_4$ flow rate to the $SiH_4$ flow rate is in the range from about 0 to 0.6.

If the ratio of the $BCl_3$ flow rate to the $SiH_4$ flow rate is less than about 0.000017, the resistance of the film becomes excessively large (since the boron concentration becomes excessively small). Thus, the film cannot be used as a gate electrode. Further, if the ratio of the $BCl_3$ flow rate to the $SiH_4$ flow rate is greater than about 0.028, the boron concentration in the film becomes close to the limit of a solid solubility. Thus, the excessive boron incorporated in the film above the solid solubility limit would not be activated, resulting in the gas waste of boron source. Accordingly, the preferable ratio of the $BCl_3$ flow rate to the $SiH_4$ flow rate is in the range from about 0.000017 to 0.028.

Any amorphous or polycrystalline films can be formed by adoptively adjusting the film forming conditions described above.

EXAMPLE

The boron doped silicon-germanium film was deposited on 8 inch wafers by using the apparatus 100 shown in FIG. 1. The thin film forming conditions, i.e., the flow rate ratios of $SiH_4$, $GeH_4$ and $BCl_3$, are listed in Table 1.

TABLE 1

| the flow rate ratios of the film forming gases | | |
|---|---|---|
| $GeH_4$/$SiH_4$ via main line | $GeH_4$ via 4 supplement lines/$SiH_4$ via main line | $BCl_3$ via doping line/$SiH4$ via main line |
| 0.038 | 0.006 × 4 | 0.004 |

In Table 1, $GeH_4$/$SiH_4$ and $BCl_3$/$SiH_4$ represent the flow rate ratios of $GeH_4$ to $BCl_3$ to $SiH_4$, respectively.

The film forming temperature was set to be in the range from about 450 to 550° C.; the film forming pressure was set to be in the range from about 30 and 120 Pa; and the gap between the wafers was about 5.2 mm.

Figure 3:
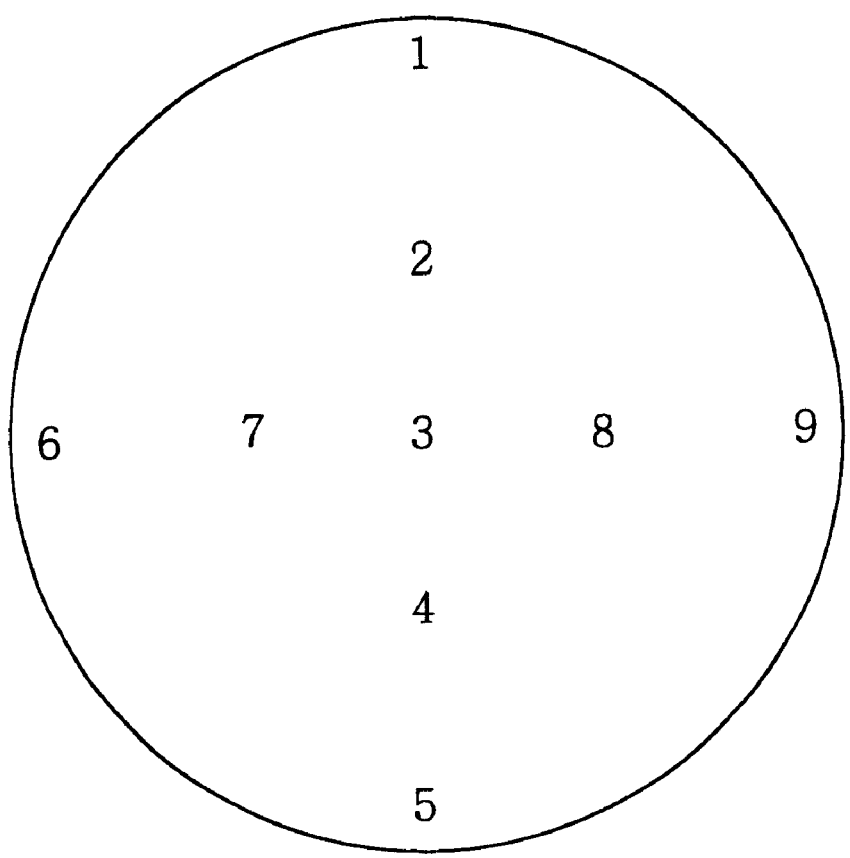
FIG. 3 sets forth spots at which sheet resistance of a boron doped silicon germanium film on a wafer is measured.

After the boron doped silicon-germanium film was formed, its sheet resistance was measured at 9 spots as shown in FIG. 3. Then, the uniformity of the sheet resistances within a single wafer and between the wafers was obtained. The sheet resistance is inversely proportional to the boron concentration. That is, increased intra-wafer and inter-wafer uniformities of the sheet resistance imply that the boron concentration is uniform within a wafer and also between wafers.

Table 2 shows a sheet resistance distribution in the boron doped silicon-germanium film formed by the method described above, wherein the sheet resistance was measured at the 9 spots shown in FIG. 3. The intra-wafer uniformity of sheet resistance represents the amounts of deviation of a minimum and a maximum sheet resistance measured from the average value thereof (the less the value of ununiformity, the better the uniformity).

TABLE 2

| sheet resistance distribution [Ω/square] of the boron doped silicon-germanium film formed by employing $BCl_3$ | | | | | | | | | |
|---|---|---|---|---|---|---|---|---|---|
| spot NO. | | | | | | | | | |
| | 1 | 2 | 3 | 4 | 5 | 6 | 7 | 8 | 9 | intra-wafer uniformity |
| sheet resistance | 83.5 | 83.7 | 83.6 | 83.5 | 83.4 | 82.7 | 83.7 | 83.1 | 81.6 | ±1.27 % |

The sheet resistance values listed in Table 2 were obtained from the boron doped silicon-germanium film deposited on the wafer loaded at the center region of the boat 3 under the conditions described above. For comparison, the sheet resistance values of a boron doped silicon germanium film formed by employing $B_2H_6$ are listed in Table 3.

TABLE 3 sheet resistance distribution [$\Omega$/square] of the boron doped silicon-germanium film formed by employing $B_2H_6$

| | spot NO. | | | | | | | | | |
|---|---|---|---|---|---|---|---|---|---|---|
| | 1 | 2 | 3 | 4 | 5 | 6 | 7 | 8 | 9 | uniformity |
| sheet resistance | 2390 | 4992 | 4711 | 4584 | 2510 | 3420 | 5119 | 5132 | 3130 | ±36.4% |

The boron doped silicon-germanium film used for obtaining the sheet resistance values listed in Table 3 was formed on the wafer by using the apparatus 100 shown in FIG. 1 while supplying $B_2H_6$ gas as a doping gas through the doping gas line 14. Other film forming conditions were identical to those used in forming the boron doped silicon-germanium film used for obtaining the sheet resistance values listed in Table 2.

As can be clearly seen from the comparison of the data in Tables 2 and 3, the intra-wafer uniformity of sheet resistance, i.e., boron concentration, can be substantially improved by using, in lieu of $B_2H_6$, $BCl_3$ as the doping source in accordance with the present invention.

The inter-wafer uniformity of sheet resistance in boron doped silicon-germanium films formed in accordance with the present invention is shown in Table 4.

TABLE 4 inter-wafer uniformity of sheet resistance [$\Omega$/square] of films grown by using the $BCl_3$ as the doping source

| loading region | top | center | bottom | inter-wafer uniformity |
|---|---|---|---|---|
| sheet resistance | 105.8 | 83.2 | 88.8 | ±11.9% |

The sheet resistance values listed in Table 4 were obtained by averaging sheet resistance values measured at 9 spots (as shown in FIG. 3) of a wafer chosen from each of the top, the center and the bottom region of the boat 3. The inter-wafer uniformity in Table 4 was calculated in an identical manner as in the intra-wafer uniformity shown in Table 2 (therefore, the smaller the uniformity value, the better the uniformity). For comparison, the boron doped silicon germanium films were grown by using $B_2H_6$ as the doping gas and their sheet resistance uniformity between wafers were measured as listed in Table 5.

TABLE 5 inter-wafer uniformity of sheet resistance [$\Omega$/square] of films grown by using $B_2H_6$ as the doping gas

| loading region | top | center | bottom | inter-wafer uniformity |
|---|---|---|---|---|
| sheet resistance | 4775 | 3998 | 1560 | ±50.7% |

The boron doped silicon-germanium films used in obtaining the sheet resistance values listed in Table 5 were formed in an identical manner as the films for Table 4, excepting that $B_2H_6$ was used, instead of $BCl_3$, as the doping source; and the sheet resistance values and their inter-wafer uniformity were obtained in the identical fashion as in Table 4.

As can be seen clearly by comparing the data in Tables 4 and 5, the inter-wafer uniformity of sheet resistance, i.e., boron concentration was substantially improved by using, in lieu of $B_2H_6$, $BCl_3$ as the doping gas in accordance with the present invention.

While conducting a series of experiments in accordance with the present invention, it was found that the growth rate of the boron doped silicon-germanium film is remarkably increased by the use of $BCl_3$ as the doping source. The growth rates at different flow rates of $BCl_3$ are listed in Table 6. The flow rate ratios of $SiH_4$ and $GeH_4$ were same as listed in Table 1.

TABLE 6 varying growth rates with different flow rates of $BCl_3$

| flow rate of $BCl_3$ [sccm] | 0 | 150 | 400 |
|---|---|---|---|
| growth rate [nm/min] | 1.1 | 2.7 | 3.0 |

The increment in the growth rate as shown in Table 6 is induced by a catalytic action of boron, which enables the boron doped silicon-germanium film to grow rapidly even in low temperature range from about 350 to 450° C. Further, it is also possible to control the boron concentration by varying the flow rate of $BCl_3$.

While the invention has been shown and described with respect to the preferred embodiments, it will be understood by those skilled in the art that various changes and modifications may be made without departing from the spirit and scope of the invention as defined in the following claims.

What is claimed is:

1. A semiconductor device fabricating method for forming a boron doped silicon-germanium film on one or more substrates in a reaction furnace of a low pressure CVD apparatus, comprising the steps of:

loading said one or more substrates into the reaction furnace;

supplying $GeH_4$ and $SiH_4$ as a reaction gas to the reaction furnace; and supplying $BCl_3$ as a doping gas to the reaction furnace.

2. The method of claim 1, wherein if a plurality of substrates are processed in the reaction furnace at a time, $GeH_4$ is supplied at two or more locations in the reaction furnace and the doping gas is supplied at least at an upstream side of gas flow in the reaction furnace.

3. The method of claim 1, wherein the boron doped silicon-germanium film is formed at a temperature ranging from about 350 to 550° C.

4. The method of claim 1, wherein the boron doped silicon-germanium film is formed at a pressure ranging from about 10 to 130 Pa.

5. The method of claim 1, wherein the boron doped silicon-germanium film is formed at a partial pressure of $SiH_4$ ranging from about 10 to 79.8 Pa.

6. The method of claim 1, wherein the boron doped silicon-germanium film is formed at a partial pressure of $BCl_3$ ranging from about 0.00016 to 2.2 Pa.

7. The method of claim 1, wherein the boron doped silicon-germanium film is formed at a flow rate ratio of $GeH_4$ to $SiH_4$ being equal to or less than about 0.6.

8. The method of claim 1, wherein the boron doped silicon-germanium film is formed at a flow rate ratio of $BCl_3$ to $SiH_4$ ranging from about 0.000017 to 0.028.

9. A substrate processing apparatus for forming a boron doped silicon-germanium film on a wafer, comprising:

a reaction tube in which at least one substrate is processed;

a heater for heating said at least one substrate in the reaction tube;

a first gas supplying line for supplying $SiH_4$ to the reaction tube;

a second gas supplying line for supplying $GeH_4$ to the reaction tube; and a third gas supplying line for supplying $BCl_3$ to the reaction tube.

10. The apparatus of claim 9, wherein the second gas supplying line includes a plurality of gas outlets for supplying $GeH_4$ at different locations in the reaction tube and the third gas supplying line supplies $BCl_3$ at least at an upstream side of gas flow in the reaction tube.

* * * * *